(12) United States Patent
Park et al.

(10) Patent No.: US 11,668,011 B2
(45) Date of Patent: Jun. 6, 2023

(54) FORMING METHOD OF YTTRIUM OXIDE FLUORIDE COATING FILM AND YTTRIUM OXIDE FLUORIDE COATING FILM PREPARED THEREBY

(71) Applicants: Jae Hyuk Park, Gyeonggi-do (KR); Dae Gean Kim, Gyeonggi-do (KR); Hye Won Seok, Seoul (KR); Byung Ki Kim, Gyeonggi-do (KR)

(72) Inventors: Jae Hyuk Park, Gyeonggi-do (KR); Dae Gean Kim, Gyeonggi-do (KR); Hye Won Seok, Seoul (KR); Byung Ki Kim, Gyeonggi-do (KR)

(73) Assignee: IONES CO., LTD., Gyeonggi-do (KR)

(*) Notice: Subject to any disclaimer, the term of this patent is extended or adjusted under 35 U.S.C. 154(b) by 719 days.

(21) Appl. No.: 16/696,701

(22) Filed: Nov. 26, 2019

(65) Prior Publication Data

US 2020/0095687 A1    Mar. 26, 2020

Related U.S. Application Data

(63) Continuation of application No. PCT/KR2018/005974, filed on May 25, 2018.

(30) Foreign Application Priority Data

May 26, 2017    (KR) .................. 10-2017-0065283
May 26, 2017    (KR) .................. 10-2017-0065284

(51) Int. Cl.
     *C23C 24/08*      (2006.01)
     *C23C 24/06*      (2006.01)
     (Continued)

(52) U.S. Cl.
     CPC ............ *C23C 24/085* (2013.01); *B32B 15/04* (2013.01); *B32B 18/00* (2013.01); *C01F 17/259* (2020.01);
     (Continued)

(58) Field of Classification Search
     CPC ....... C23C 24/085; C23C 24/06; C23C 24/04; C23C 24/08; C23C 24/00; C23C 16/4404;
     (Continued)

(56) References Cited

U.S. PATENT DOCUMENTS

2008/0274347 A1* 11/2008 Iwasawa ................ C23C 24/04
                                                                                                      428/323
2016/0326058 A1* 11/2016 Nagayama .............. C23C 4/134
     (Continued)

FOREIGN PATENT DOCUMENTS

JP        2005-314801       11/2005
JP        2016/211072 A    12/2016
     (Continued)

OTHER PUBLICATIONS

Machine Translation, Kim, KR 1020100076669 A, Jul. 2010. (Year: 2010).*

*Primary Examiner* — Michael E. La Villa
(74) *Attorney, Agent, or Firm* — Reinhart Boerner Van Deuren P.C.

(57) ABSTRACT

A forming method of an yttrium oxide fluoride (YOF) coating film and a (YOF) coating film formed thereby are disclosed. The YOF coating film has no or extremely small pores therein and a nanostructure to increase light transmittance thereof, and has high hardness and high bonding strength and thus can protect a transparent window of a display device. The method for forming an YOF coating film involves the steps of: providing pretreated YOF powder having a particle diameter ranging from 0.1 to 12 μm; receiving a transfer gas supplied from a transfer gas supply unit and receiving the pretreated YOF powder supplied from a powder supply unit to transfer the pretreated YOF powder in an aerosol state; and colliding/smashing (spraying) the pretreated YOF powder transferred in the aerosol state (Continued)

with/onto a substrate in a process chamber to form an YOF coating film on the substrate.

17 Claims, 17 Drawing Sheets

(51) Int. Cl.
| | |
|---|---|
| *C01F 17/259* | (2020.01) |
| *B32B 18/00* | (2006.01) |
| *C23C 16/44* | (2006.01) |
| *C23C 24/04* | (2006.01) |
| *H01L 21/324* | (2006.01) |
| *C23C 4/123* | (2016.01) |
| *C23C 30/00* | (2006.01) |
| *C23C 4/10* | (2016.01) |
| *C23C 24/00* | (2006.01) |
| *B32B 15/04* | (2006.01) |
| *C23C 4/11* | (2016.01) |
| *C23C 4/12* | (2016.01) |
| *C23C 4/134* | (2016.01) |
| *C23C 4/137* | (2016.01) |

(52) U.S. Cl.
CPC .................. *C23C 4/10* (2013.01); *C23C 4/11* (2016.01); *C23C 4/12* (2013.01); *C23C 4/123* (2016.01); *C23C 4/134* (2016.01); *C23C 4/137* (2016.01); *C23C 16/4404* (2013.01); *C23C 24/00* (2013.01); *C23C 24/04* (2013.01); *C23C 24/06* (2013.01); *C23C 24/08* (2013.01); *C23C 30/00* (2013.01); *C23C 30/005* (2013.01); *H01L 21/324* (2013.01); *Y10T 428/12611* (2015.01); *Y10T 428/12618* (2015.01); *Y10T 428/12993* (2015.01); *Y10T 428/2495* (2015.01); *Y10T 428/24967* (2015.01); *Y10T 428/24983* (2015.01); *Y10T 428/265* (2015.01)

(58) Field of Classification Search
CPC ......... C23C 30/00; C23C 30/005; C23C 4/10; C23C 4/11; C23C 4/12; C23C 4/123; C23C 4/134; C23C 4/137; C01F 17/259; H01L 21/324; B32B 15/04; B32B 18/00; Y10T 428/12611; Y10T 428/12618; Y10T 428/2495; Y10T 428/24967; Y10T 428/265; Y10T 428/12993
See application file for complete search history.

(56) References Cited

U.S. PATENT DOCUMENTS

2017/0342539 A1* 11/2017 Sato .................. C23C 24/082
2018/0362359 A1* 12/2018 Sato .................... C23C 14/06

FOREIGN PATENT DOCUMENTS

| KR | 10-2008-0083600 | 9/2008 |
|---|---|---|
| KR | 10-2010-0076669 | 7/2010 |
| KR | 10-2011-0118939 | 11/2011 |
| KR | 10-2012-0028458 | 3/2012 |
| KR | 10-2013-0070092 | 6/2013 |
| KR | 10-1322783 | 10/2013 |
| KR | 10-2014-0126824 | 11/2014 |
| KR | 10-2015-0005931 | 1/2015 |
| WO | WO 2016/129457 A1 | 4/2017 |
| WO | WO 2017/115662 A1 | 10/2018 |

* cited by examiner

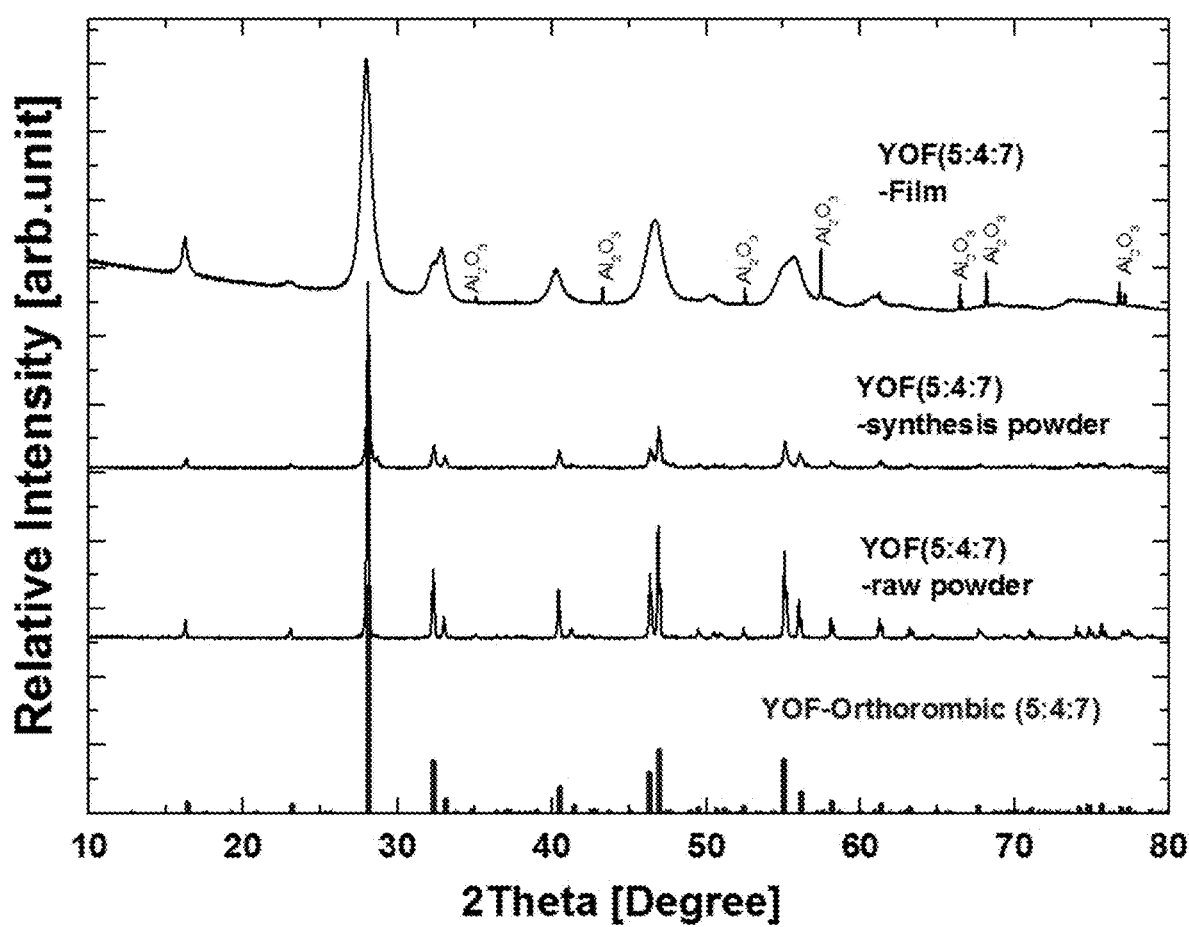

| | YOF-raw powder | | | YOF-synthesis powder | | | YOF-film | | |
|---|---|---|---|---|---|---|---|---|---|
| | Wt % | At. % | Ratio | Wt % | At. % | Ratio | Wt % | At. % | Ratio |
| Y | 68.26 | 30.01 | 5 | 62.57 | 24.96 | 5 | 70.56 | 32.38 | 5 |
| O | 12.16 | 29.70 | 4.9 | 14.76 | 32.72 | 6.5 | 10.96 | 27.95 | 4.3 |
| F | 19.59 | 40.30 | 6.7 | 22.67 | 42.32 | 8.5 | 18.47 | 39.67 | 6.1 |

FIG. 11C

| | YOF-raw powder | | | YOF-synthesis powder | | | YOF-film | | |
|---|---|---|---|---|---|---|---|---|---|
| | Wt % | At. % | Ratio | Wt % | At. % | Ratio | Wt % | At. % | Ratio |
| Y | 69.69 | 31.16 | 1 | 69.14 | 30.61 | 1 | 72.06 | 33.64 | 1 |
| O | 13.82 | 34.33 | 1.1 | 14.03 | 34.52 | 1.1 | 13.05 | 33.84 | 1 |
| F | 16.49 | 34.51 | 1.1 | 16.83 | 34.87 | 1.1 | 14.89 | 32.52 | 1 |

FIG. 12

| | | YOF-raw powder | YOF-synthesis powder | YOF-film |
|---|---|---|---|---|
| YOF (5:4:7) | XRD | Orthorhombic | Orthorhombic | Orthorhombic |
| | EDS [Y : O : F] | 5 : 4.9 : 6.7 | 5 : 6.5 : 8.5 | 5 : 4.3 : 6.1 |
| YOF (1:1:1) | XRD | Rhombohedral | Rhombohedral | Rhombohedral |
| | EDS [Y : O : F] | 1 : 1.1 : 1.1 | 1 : 1.1 : 1.1 | 1 : 1 : 1 |

FORMING METHOD OF YTTRIUM OXIDE FLUORIDE COATING FILM AND YTTRIUM OXIDE FLUORIDE COATING FILM PREPARED THEREBY

CROSS-REFERENCE TO RELATED APPLICATIONS

This application claims priority to and the benefit of Korean Patent Application Nos. 10-2017-0065283 and 10-2017-0065284 both filed May 26, 2017, in the Korean Intellectual Property Office, PCT/KR2018/005974 filed May 25, 2018 in WIPO, and all the benefits accruing therefrom under 35 U.S.C. 119, the contents of which in its entirety are herein incorporated by reference.

BACKGROUND

1. Field

The present invention relates to a forming method of yttrium oxide fluoride coating film and a yttrium oxide fluoride coating film thereof.

2. Description of the Related Art

Generally known display devices may include a liquid crystal display (LCD), an organic light emitting diode (OLED) display, a field effect display (FED), an electrophoretic display, or the like. In addition, a display device typically includes a display module for displaying images and a transparent window for protecting the display module.

In order to ensure a higher etch rate and a finer linewidth, highly corrosive chlorine- or fluorine-based gases are used in the manufacture of semiconductor and/or display devices. Manufacturing equipment operated under such a harsh environment generally includes on its surface a protective film having high resistance against plasma and corrosive gases to attain its operational advantages and extended service life.

PRIOR ART DOCUMENTS

Patent Documents

1. Korean Patent Publication No. 10-2014-0126824 (Nov. 3, 2014)
2. Korean Patent Registration No. 10-1322783 (Oct. 29, 2013)

SUMMARY

Various embodiments of the present invention provide a forming method of an yttrium oxide fluoride (YOF) coating film, which has extremely small pores therein (or an extremely high packing factor) and a nanostructure to increase light transmittance thereof, and has high hardness and high bonding strength and thus can protect a transparent window of a display device, and a YOF coating film formed by the forming method.

In addition, various embodiments of the present invention provide a forming method of an yttrium oxide fluoride (YOF) coating film, which has high etching resistance against corrosive gases and high-speed colliding ion particles owing to high hardness, thereby protecting components of semiconductor/display devices during an etching process, and a YOF coating film formed by the forming method.

According to various embodiments of the present invention, there is provided a forming method of an yttrium oxide fluoride (YOF) coating film, the method including the steps of providing unpretreated YOF powder containing yttrium (Y), oxygen (O) and fluorine (F), providing a pretreated YOF powder by pretreating the unpretreated YOF powder, receiving a transfer gas supplied from a transfer gas supply unit and receiving the pretreated YOF powder supplied from a powder supply unit to transfer the pretreated YOF powder in an aerosol state, and colliding/smashing (spraying) the pretreated YOF powder transferred in the aerosol state with/onto a substrate in a process chamber to form an yttrium oxide fluoride (YOF) coating film on the substrate.

The pretreated YOF powder has a particle diameter of 0.1 μm to 12 μm.

The pretreating step may be performed by smashing the unpretreated YOF powder and then heat-treating the same at a temperature of between about 100° C. and 1000° C.

The pretreating step may be performed by heat-treating the unpretreated YOF powder at a temperature of between about 100° C. and 1000° C.

When the YOF coating film has a thickness of 0.5 μm to 20 μm, visible light transmittance of the YOF coating film may range from 50% to 95%.

The YOF coating film may have a haze value of 0.5% to 5%.

The YOF coating film may have hardness of 6 GPa to 12 GPa.

The YOF coating film may have a porosity of 0.01% to 1%, hardness of 6 GPa to 12 GPa, and a withstand voltage property ranging from 50 V/μm to 150 V/μm.

An yttrium (Y):oxide (O):fluoride (F) composition ratio of the unpretreated YOF powder, the pretreated YOF powder and the YOF coating film, as determined by energy-dispersive X-ray spectroscopy (EDS), may be 5:4:7 or 1:1:1.

Crystal systems of the unpretreated YOF powder, the pretreated YOF powder and the YOF coating film may include orthorhombic or rhombohedral phases.

The substrate may be a transparent window of a display device or a component exposed to a plasma environment.

The transparent window may be a glass substrate, a plastic substrate, a sapphire substrate or a quartz substrate, and the component is an internal component of a processing chamber for manufacturing semiconductor or display devices.

The component may be one selected from the group consisting of an electro static chuck, a heater, a chamber liner, a shower head, a boat for CVD (Chemical Vapor Deposition), a focus ring, a wall liner, a shield, a cold pad, a source head, an outer liner, a deposition shield, an upper liner, an exhaust plate, an edge ring and a mask frame.

According to various embodiments of the present invention, there is provided an yttrium oxide fluoride coating film formed by the forming method of claim 1, wherein when the YOF coating film has a thickness of 0.5 μm to 20 μm, visible light transmittance of the YOF coating film may range from 50% to 95%. The YOF coating film may have a haze value of 0.5% to 5%.

According to various embodiments of the present invention, there is provided an yttrium oxide fluoride (YOF) coating film formed by the forming method stated above, wherein an yttrium (Y):oxide (O):fluoride (F) composition ratio of the unpretreated YOF powder, the pretreated YOF powder and the YOF coating film, as determined by energy-dispersive X-ray spectroscopy (EDS), may be 5:4:7 or 1:1:1. The YOF coating film may have hardness of 6 GPa to 12 GPa. When the YOF coating film has a thickness of 0.5 μm to 20 μm, visible light transmittance of the YOF coating film may range from 50% to 95%.

Advantageous Effects of Invention

As described above, the present invention provides a forming method of an yttrium oxide fluoride (YOF) coating film, which has extremely small pores therein (or an extremely high packing factor) and a nanostructure to increase light transmittance thereof, and has high hardness and high bonding strength and thus can protect a transparent window of a display device, and a YOF coating film formed by the forming method.

In other words, the thin film according to the present invention has a porosity of about 0.01% to about 1%, light transmittance of about 50% to about 95% (when the film has a thickness of 0.5 μm to 20 μm), hardness of about 6 GPa to about 12 GPa, which are advantageous enough to be used as a protective film of a transparent window.

In addition, the present invention provides a forming method of an yttrium oxide fluoride (YOF) coating film using yttrium oxide fluoride having sublimation heat of a high temperature, which reacts with an etching gas to be vaporized, thereby protecting components of semiconductor/display devices during an etching process, and a YOF coating film formed by the forming method.

In other words, since the coating film according to the present invention has high etching resistance against corrosive gases and high-speed colliding ion particles owing to high hardness, components of semiconductor/display devices can be protected during an etching process. In addition, the coating film according to the present invention has a withstand voltage property ranging from about 50 V/μm to about 150 V/μm, which satisfies the withstand voltage requirement for the manufacture of semiconductor/display devices.

BRIEF DESCRIPTION OF THE DRAWINGS

FIGS. 10A and 10B show X-ray diffraction (XRD) patterns for phase analysis results and energy-dispersive X-ray spectroscopy (EDS) analysis results of unpretreated YOF powder, pretreated YOF powder and a YOF coating film according to various embodiments of the present invention, and FIG. 10O shows a table summarizing weight ratios (Wt %), atomic ratios (At. %) and EDS ratios thereof.

FIG. 11C shows a table summarizing weight ratios (Wt %), atomic ratios (At. %) and EDS ratios thereof.

FIG. 12 shows a table summarizing characterization data and processing conditions of unpretreated YOF powder, pretreated YOF powder and a YOF coating film according to various embodiments of the present invention.

DETAILED DESCRIPTION

Figure 1:
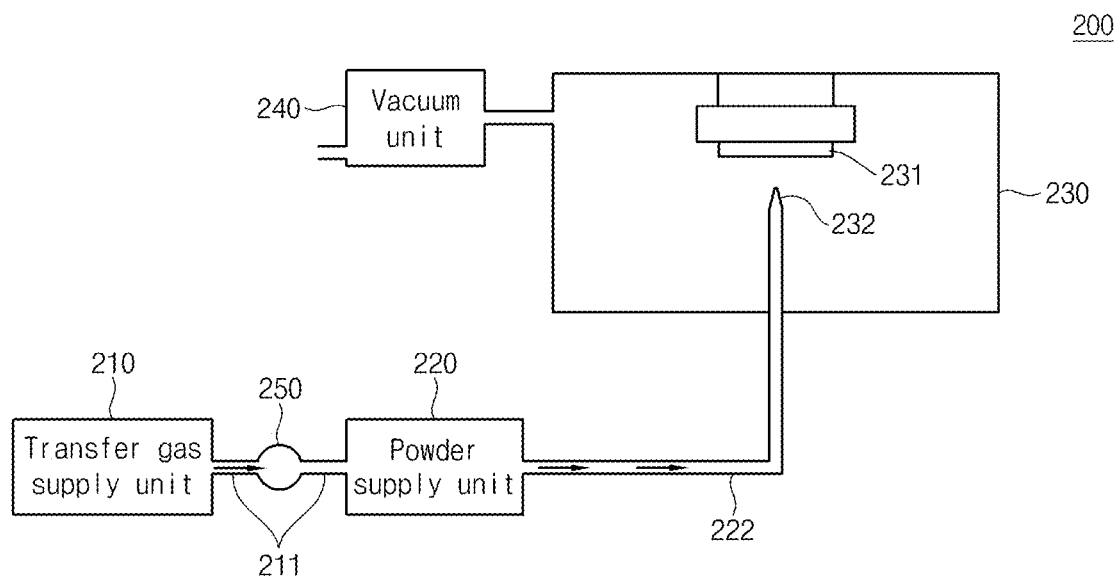
FIG. 1 is a schematic diagram of an apparatus for forming an yttrium oxide fluoride (YOF) coating film according to various embodiments of the present invention.

Hereinafter, examples of embodiments of the invention will be described in detail with reference to the accompanying drawings such that they can easily be made and used by those skilled in the art.

Various embodiments of the present invention may be embodied in many different forms and should not be construed as being limited to the example embodiments set forth herein. Rather, these example embodiments of the disclosure are provided so that this disclosure will be thorough and complete and will convey inventive concepts of the disclosure to those skilled in the art.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the drawings, the thickness of layers and regions are exaggerated for clarity. As used herein, the term "and/or" includes any and all combinations of one or more of the associated listed items.

Figure 2:
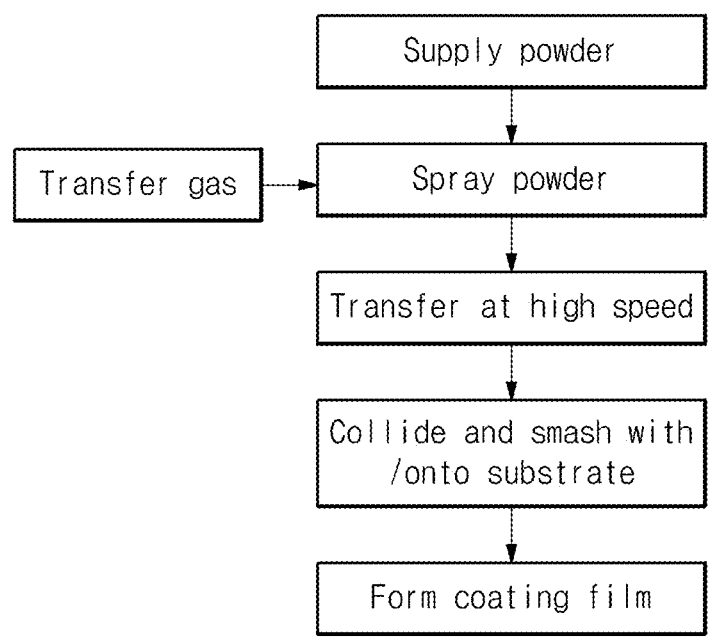
FIG. 2 is a flow diagram illustrating a forming method of a YOF coating film according to various embodiments of the present invention.

FIG. 1 is a schematic diagram of an apparatus for forming an yttrium oxide fluoride (YOF) coating according to various embodiments of the present invention, and FIG. 2 is a flow diagram illustrating a forming method of a YOF coating film according to various embodiments of the present invention.

As shown in FIG. 1, the YOF coating film forming apparatus 200 according to the present invention includes a transfer gas supply unit 210, a powder supply unit 220 storing and supplying pretreated YOF powder, a transfer pipe 222 rapidly transferring the pretreated YOF powder from the powder supply unit 220 using a transfer gas in an aerosol state, a nozzle 232 coating/laminating or spraying/jetting the pretreated YOF powder from the transfer pipe 222 onto a substrate 231, and a process chamber 230 colliding/smashing the pretreated YOF powder transferred from the nozzle 232 with/onto a surface of the substrate to form an yttrium oxide fluoride (YOF) coating film having a predetermined thickness on the substrate.

Here, the aerosol state means a state in which the pretreated YOF powder having a particle diameter in the range from about 0.1 μm to about 12 μm dispersed in the transfer gas.

The forming method of the YOF coating film according to the present invention will be described with reference to FIGS. 1 and 2.

The transfer gas stored in the transfer gas supply unit 210 may include, but not limited to, one or two kinds of mixtures selected from the group consisting of oxygen, helium, nitrogen, argon, carbon dioxide, hydrogen, and equivalents thereof. The transfer gas is directly supplied from the transfer gas supply unit 210 to the powder supply unit 220 through a pipe 211, and the flow rate and pressure of the transfer gas may be controlled by a flow rate controller 250.

The powder supply unit 220 stores and supplies a large quantity of pretreated YOF powder. The pretreated YOF powder is in an aerosol state by the transfer gas of the transfer gas supply unit 210 and is supplied to the substrate 231 provided in the process chamber 230 through the transfer pipe 222 and the nozzle 232.

The process chamber 230 may be maintained in a vacuum while forming the YOF coating film. To this end, a vacuum unit 240 may be connected to the process chamber 230. In more detail, the pressure of the process chamber 230 may be in the range from about 1 Pascal to about 800 Pascals, and the pressure of the pretreated YOF powder transferred by the high-speed transfer pipe 222 may be in the range from about 500 Pascals to about 2000 Pascals. However, under all circumstances, the pressure of the high-speed transfer pipe 222 should be higher than that of the process chamber 230.

In addition, the internal temperature of the process chamber 230 may be maintained to be in the range from about 0° C. to about 30° C. Therefore, a separate member for increasing or decreasing the internal temperature of the process chamber 230 may not be necessarily provided. That is to say, the internal temperature of the process chamber 230 may be maintained at a temperature in the range from about 0° C. to about 30° C. without separately heating a transfer gas and/or a substrate. Therefore, according to the present invention, the substrate may not be susceptible to thermal shock when a transparent protective film is formed for a window of a display device.

However, in some cases, in order to improve deposition efficiency and compactness of a YOF coating film, a transfer gas or/and a substrate may be heated at a temperature of about 30° C. to about 1000° C. That is to say, the transfer gas in the transfer gas supply unit 210 or the substrate 231 in the process chamber 230 may be heated by a separate heater (not shown). The stress applied to pretreated YOF powder while forming the YOF coating film may be reduced by heating the transfer gas or/and the substrate, thereby obtaining the YOF coating film having small and compact pores. Here, if the temperatures of the transfer gas or/and the substrate are higher than about 1000° C., the pretreated YOF powder may be melted to cause a rapid phase transition. Accordingly, the YOF coating film may have an increased porosity (a reduced packing factor), making the YOF coating film internally unstable.

However, the present invention does not limit the temperature ranges to those disclosed herein. The ranges of the transfer gas, the substrate and/or the internal temperature of the process chamber may be adjusted to be between 0° C. and 1000° C. according to characteristics of the substrate on which the film is to be formed. That is to say, as described above, in order to form a film on a window of a display device, a processing temperature in the range from about 0° C. to about 30° C. may be supplied, and in order to form a film on semiconductor/display manufacturing equipment, a processing temperature in the range from about 0° C. to about 1000° C. may be supplied.

Meanwhile, as described above, a pressure difference between the process chamber 230 and the high-speed transfer pipe 222 (or the transfer gas supply unit 210 or the powder supply unit 220) may be about 1.5 times to about 2000 times. If the pressure difference is smaller than about 1.5 times, it may be difficult to transfer the pretreated YOF powder at a high speed. If the pressure difference is greater than about 2000 times, the substrate surface may be over-etched by the pretreated YOF powder.

The pretreated YOF powder supplied from powder supply unit 220 is rapidly transferred to the process chamber 230 according to the pressure difference between the process chamber 230 and the transfer pipe 222 while being sprayed through the transfer pipe 222.

In addition, the nozzle 232 connected to the transfer pipe 222 is provided in the process chamber 230 to make the pretreated YOF powder collide/smash against the substrate 231 at a speed of about 100 m/s to about 500 m/s. That is to say, the pretreated YOF powder supplied through the nozzle 232 is crushed and/or milled by kinetic energy obtained during transferring and collision energy generated during high-speed collision, thereby ultimately forming the YOF coating film having a predetermined thickness on the surface of the substrate 231.

Figure 3:
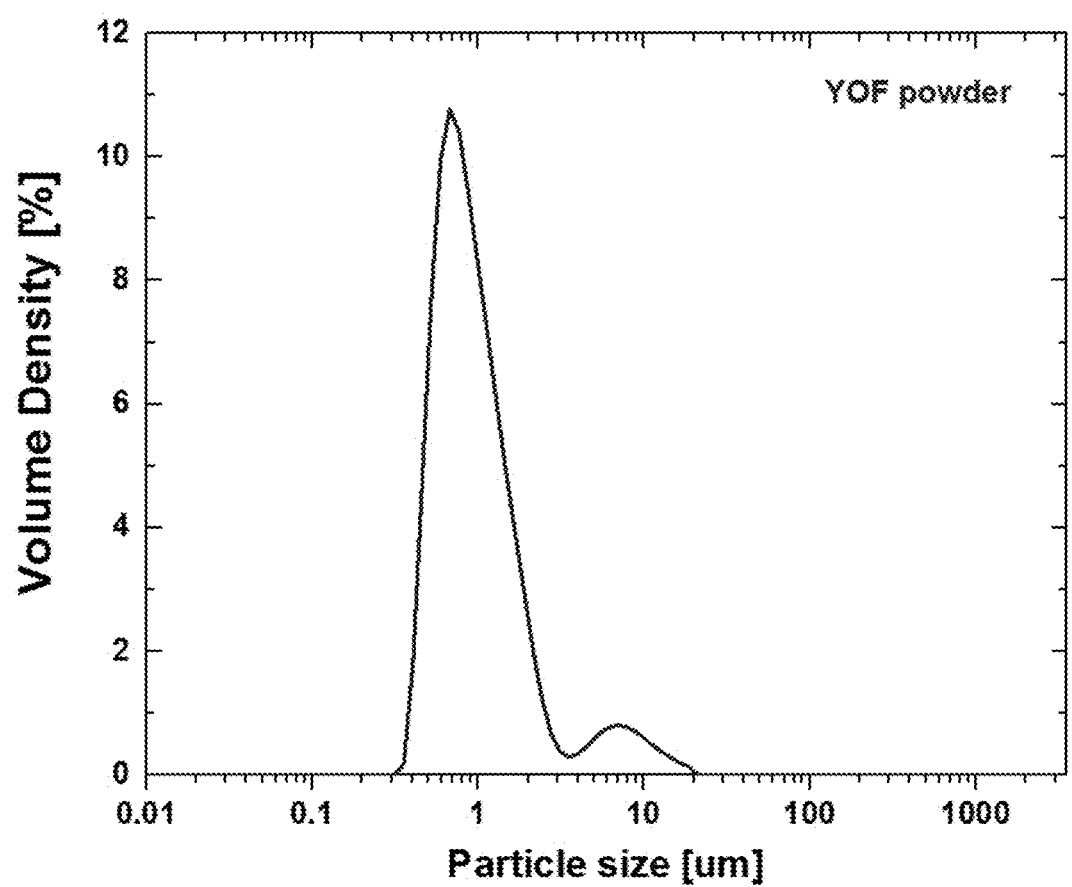
FIG. 3 is a graph showing the particle size and volume density of YOF powder for forming the YOF coating film according to various embodiments of the present invention.

FIG. 3 is a graph showing the particle size and volume density of YOF powder for forming the YOF coating film according to various embodiments of the present invention. In FIG. 3, the X axis indicates a particle size (μm) of YOF powder, and the Y axis indicates a volume density (%) of YOF powder.

As shown in FIG. 3, the YOF powder used in aerosol spray coating or room temperature vacuum spraying through a pretreating process may have a particle size (diameter) of 0.1 μm to 12 μm.

Meanwhile, the pretreating process may be performed by annealing (heat-treating) the unpretreated YOF powder (i.e., YOF-raw powder) at a temperature of between about 100° C. and 1000° C. and/or smashing the same. Here, only the annealing may be performed, or the smashing may be performed after the annealing, the annealing may be performed after the smashing, or the annealing and the smashing may be simultaneously performed.

In an example embodiment, the unpretreated YOF powder may be smashed for about one hour to about 30 hours through a ball-mill process using balls made of high-purity zirconia, alumina and/or an alloy thereof, which have a diameter of about 5 mm to about 20 mm. In addition, the unpretreated YOF powder may be annealed at a temperature of between about 100° C. and 1000° C. for about one hour to about 30 hours.

As the result of such smashing and/or annealing processes, the pretreated YOF powder is obtained. The pretreated YOF powder is then subjected to the aerosol spray coating or room temperature vacuum, yielding a transparent YOF coating film.

In addition, the pretreating process, that is, the smashing and/or annealing steps, can be commonly applied to all embodiments of the present disclosure.

Figure 4:
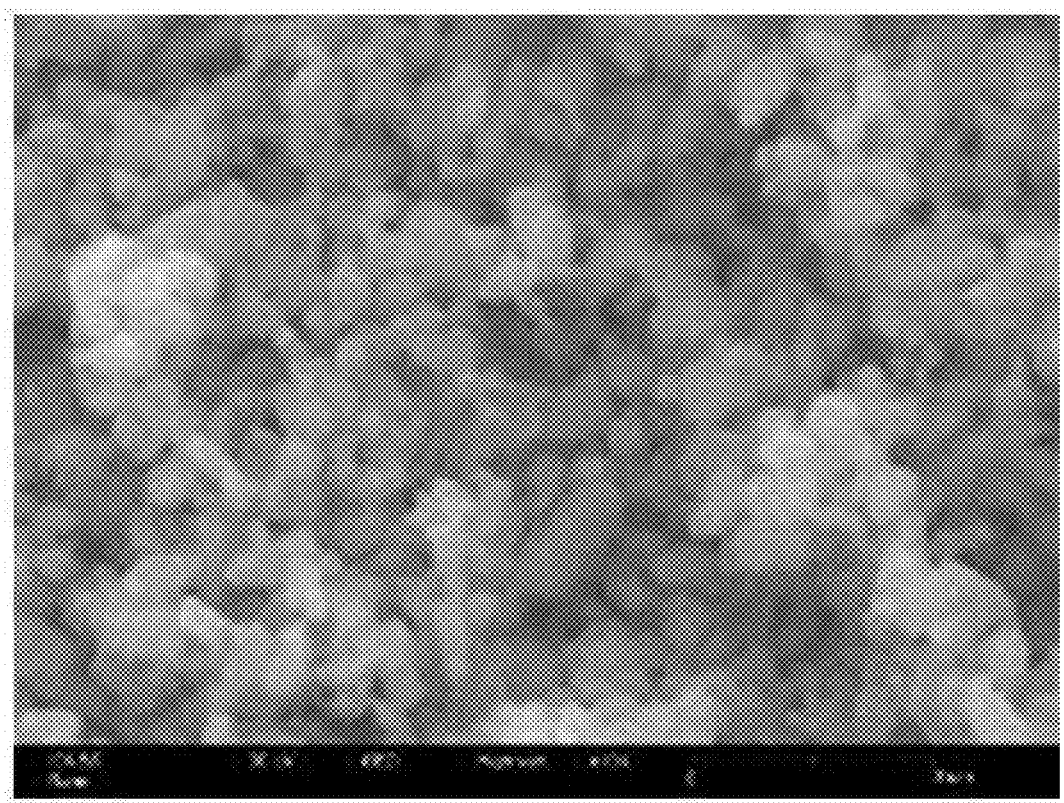
FIG. 4 shows a photographic image of pretreated YOF powder for forming the YOF coating film according to various embodiments of the present invention.

FIG. 4 shows a photographic image of pretreated YOF powder for forming the YOF coating film according to various embodiments of the present invention.

As shown in FIG. 4, the pretreated YOF powder may have, but not limited to, a substantially needle-like shape, a spherical shape or a prismatic shape. Additionally, the pretreated YOF powder may have a variety of shapes.

Figure 5:
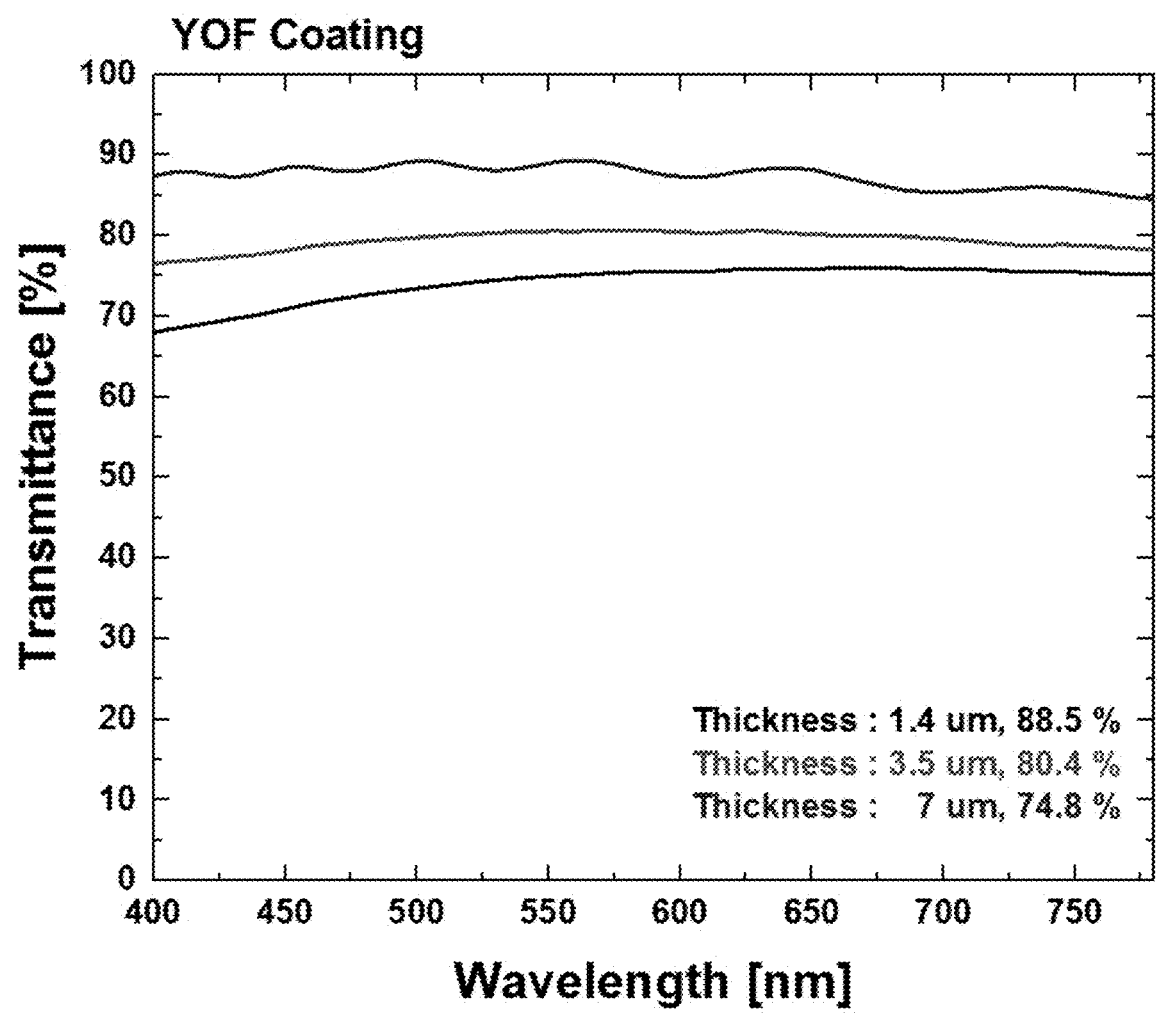
FIG. 5 is a graph showing the transmittance of a YOF coating film according to various embodiments of the present invention relative to the wavelength of light.

FIG. 5 is a graph showing transmittance of a YOF coating film according to various embodiments of the present invention relative to the wavelength of light. In FIG. 5, the X axis indicates a wavelength (nm) of light, and the Y axis indicates transmittance (%). Here, it is assumed that the YOF coating film has a thickness of about 1.4 μm to about 7 μm.

As shown in FIG. 5, in the wavelength range of about 400 nm to about 700 nm (i.e., in the visible light area), the YOF coating film according to the embodiment of the present invention demonstrated transmittance of about 88.5% when the YOF coating film had a thickness of about 1.4 μm, and transmittance of about 74.8% when the YOF coating film had a thickness of about 7 μm. That is to say, the transmittance of the YOF coating film was in the range from about 50% to about 95% with the thickness of the YOF coating film increasing up to about 20 μm. Therefore, it is confirmed that the YOF coating film according to the present invention can be suitably used as a protective film for a transparent window of a display device.

Here, when the unpretreated YOF powder (i.e., YOF—raw powder) was used when forming the YOF coating film, no YOF coating film was formed and comparable data for transmittance was unobtainable. That is to say, in a case of using the YOF powder that was not pretreated by, for example, smashing and/or annealing, a film having a predetermined thickness was not formed on a substrate, making transmittance comparison impossible.

Figure 6:
FIG. 6 is a graph showing the haze of a YOF coating film according to various embodiments of the present invention.

FIG. 6 is a graph showing the haze of a YOF coating film according to various embodiments of the present invention. Like the YOF coating film shown in FIG. 5, the YOF coating film has a thickness of about 1.5 μm.

As shown in FIG. 6, the YOF coating film according to the embodiment of the present invention has a haze value (scattered light transmittance relative to total transmittance, that is, the smaller the haze value, the better the transparency) of about 0.5% to about 5%, specifically 1±0.01% when the YOF coating film has a thickness of 1.5 μm. Therefore, it is understood that the YOF coating film according to the embodiment of the present invention can be suitably used in protecting a transparent window of a display device.

Figure 7:
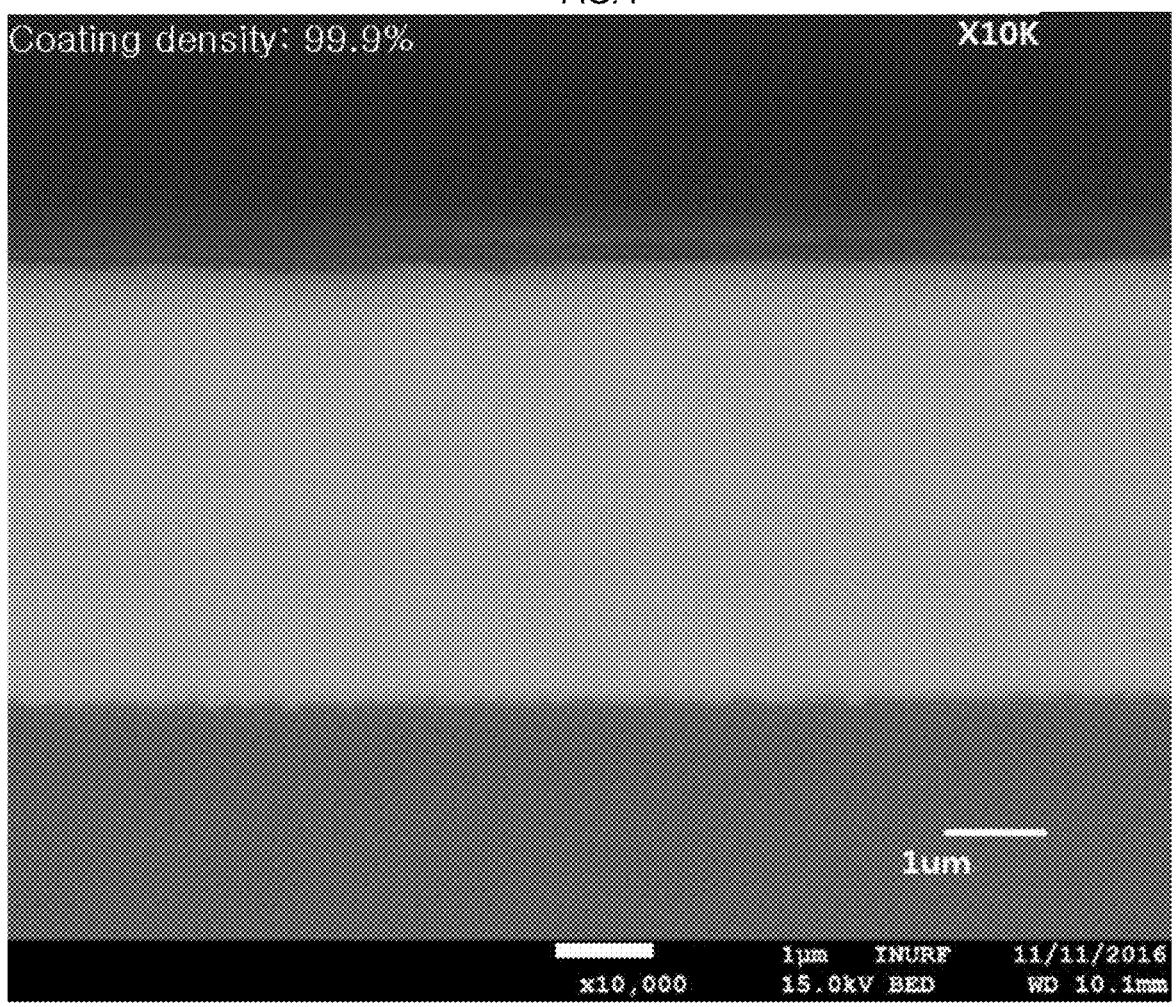
FIG. 7 is an enlarged cross-sectional view showing a YOF coating film according to various embodiments of the present invention.

FIG. 7 is an enlarged cross-sectional view showing a YOF coating film according to various embodiments of the present invention. The YOF coating film located on the substrate had no microcracks observed and demonstrated a porosity of 0.01% to 1% according to coating film processing conditions.

Figure 8:
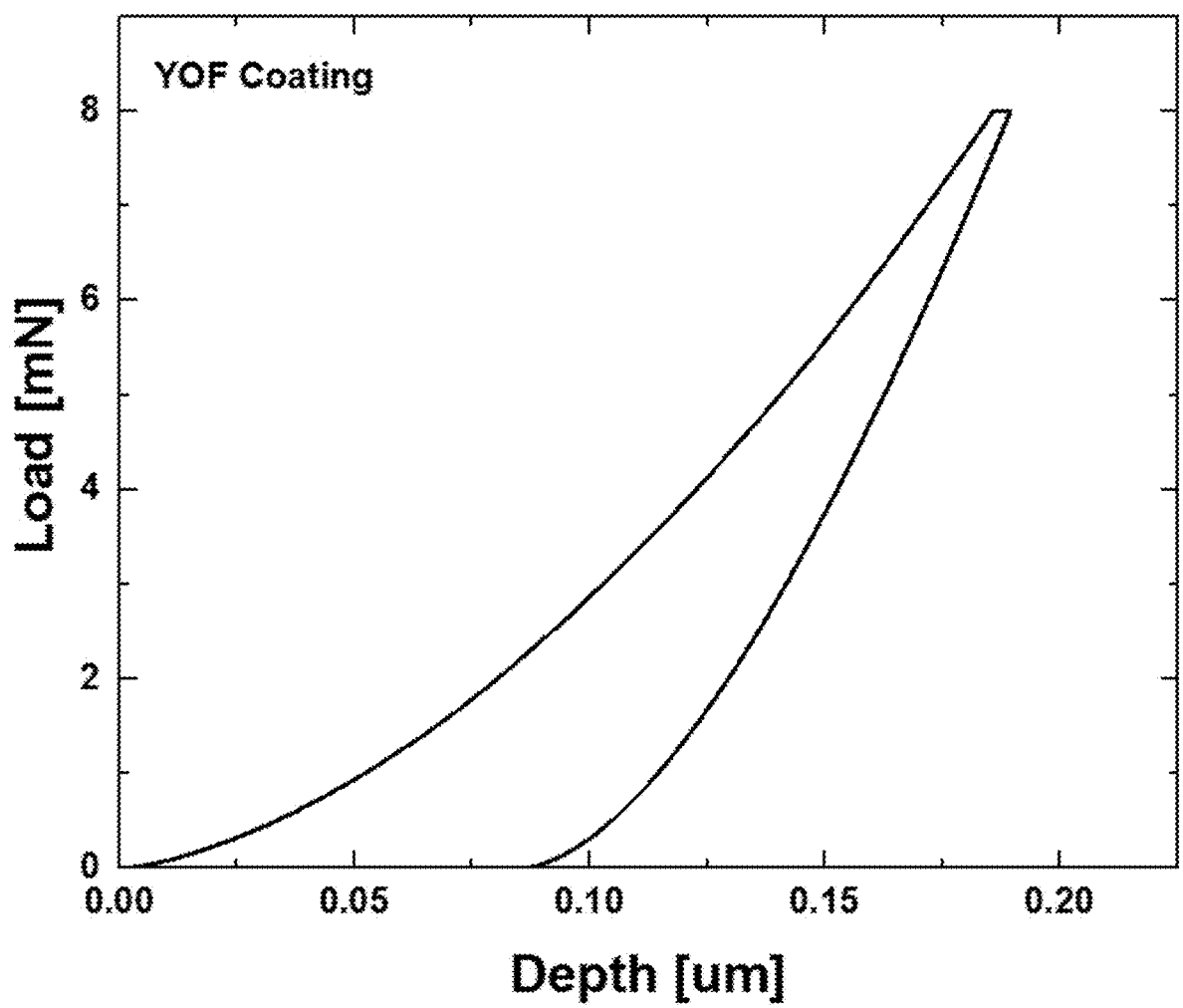
FIG. 8 is a graph showing the hardness of a YOF coating film according to various embodiments of the present invention.

FIG. 8 is a graph showing hardness of a YOF coating film according to various embodiments of the present invention. Here, the X axis indicates an indentation depth (nm) of the YOF coating film pressed by a quadrangular pyramidal diamond indenter, and the Y axis indicates a load (μN) applied by the quadrangular pyramidal diamond indenter.

As shown in FIG. 8, when the quadrangular pyramidal diamond indenter pressed the YOF coating with a load of about 0 to 8000 μN, indentation having a depth of not greater than about 200 nm was created in the YOF coating. When the quadrangular pyramidal diamond indenter was taken away from the YOF coating with a load of about 8000 to 0 μN, the indentation having a depth of about 185 to 190 nm was created in the YOF coating.

The hardness of the YOF coating can be calculated based on data from the characterization graph. The obtained hardness value of the YOF coating calculated in such a way was about 11.8 GPa. Therefore, it is confirmed that the YOF coating of the present invention has a hardness of not greater than about 12 GPa.

Here, even after the quadrangular pyramidal diamond indenter was taken away from the YOF coating, the indentation having a depth of about 185 nm remained in the YOF coating, suggesting that thermoplastic deformation occurred to the YOF coating.

Figure 9:
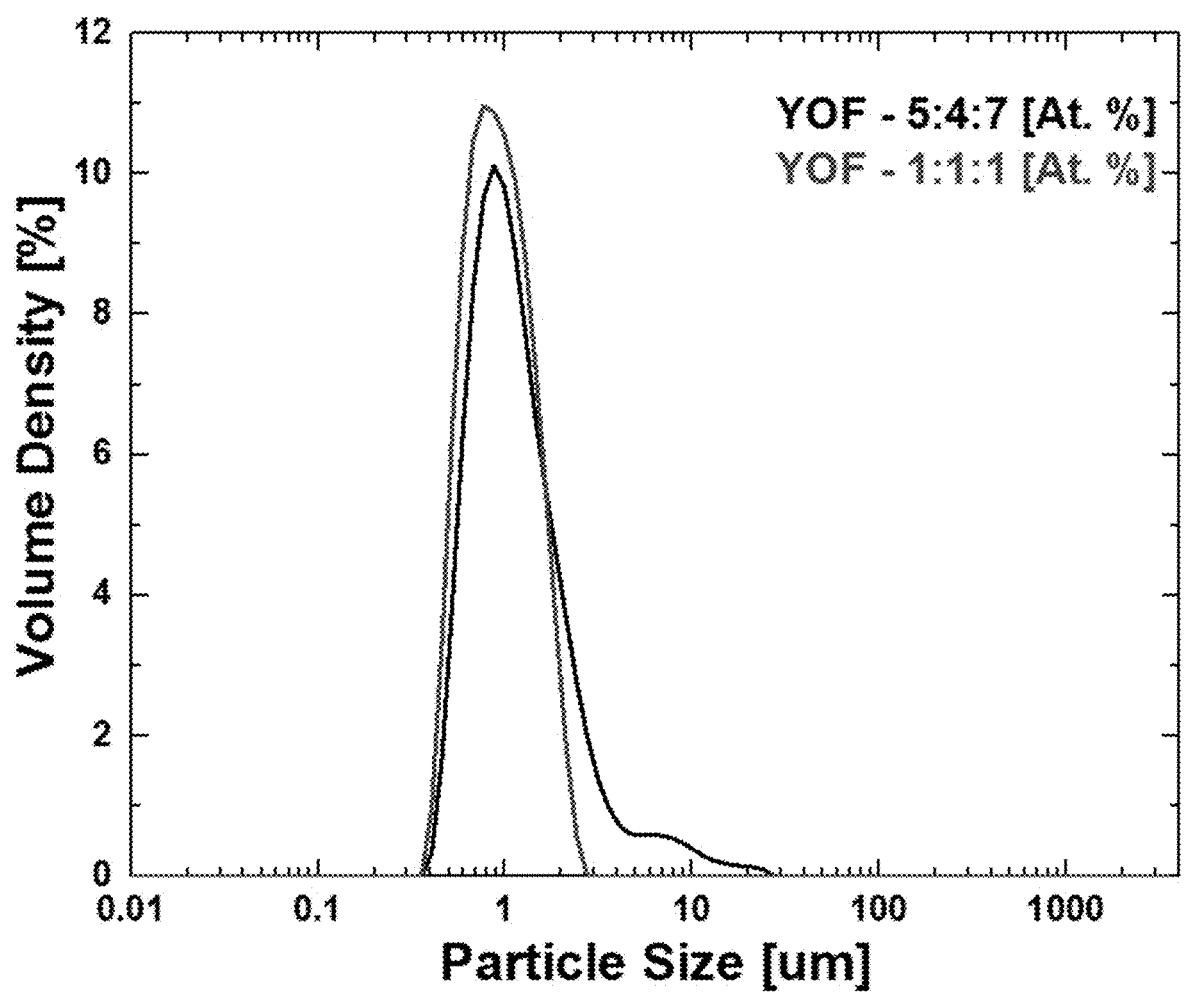
FIG. 9 is a graph showing the particle size and volume density of YOF powder before and after pretreating the YOF powder for forming the YOF coating film according to various embodiments of the present invention.

FIG. 9 is a graph showing the particle size and volume density of YOF powder before and after pretreating the YOF powder for forming the YOF coating film according to various embodiments of the present invention. In FIG. 9, the X axis indicates a particle size (μm) of YOF powder, and the Y axis indicates a volume density (%) of YOF powder.

As shown in FIG. 9, the YOF powder used in aerosol spray coating or room temperature vacuum spraying through a pretreating process, like smashing and/or annealing, may have a particle size (diameter) of 0.1 μm to 12 μm. In detail, after pretreating, the YOF powder having the composition ratio of yttrium (Y):oxide (O):fluorine (F) being about 5:4:7 has a particle size of about 0.1 μm to about 12 μm, and the YOF powder having the composition ratio of Y:O:F being about 1:1:1 has a particle size of about 0.1 μm to about 3 μm. Therefore, the YOF coating film used in the room temperature vacuum spraying can be formed using powder having an average particle size in the range from about 0.1 μm to about 12 μm.

The pretreating process of the YOF powder having the composition ratio of 5:4:1 or 1:1:1 is the same as described above, and a repeated description thereof will not be given.

The pretreated YOF powder is obtained by smashing and/or heat-treating (annealing), and is then subjected to the aerosol spray coating or room temperature vacuum spraying, thereby yielding a plasma-resistant and/or transparent YOF coating film.

Example 1

Figure 10B:
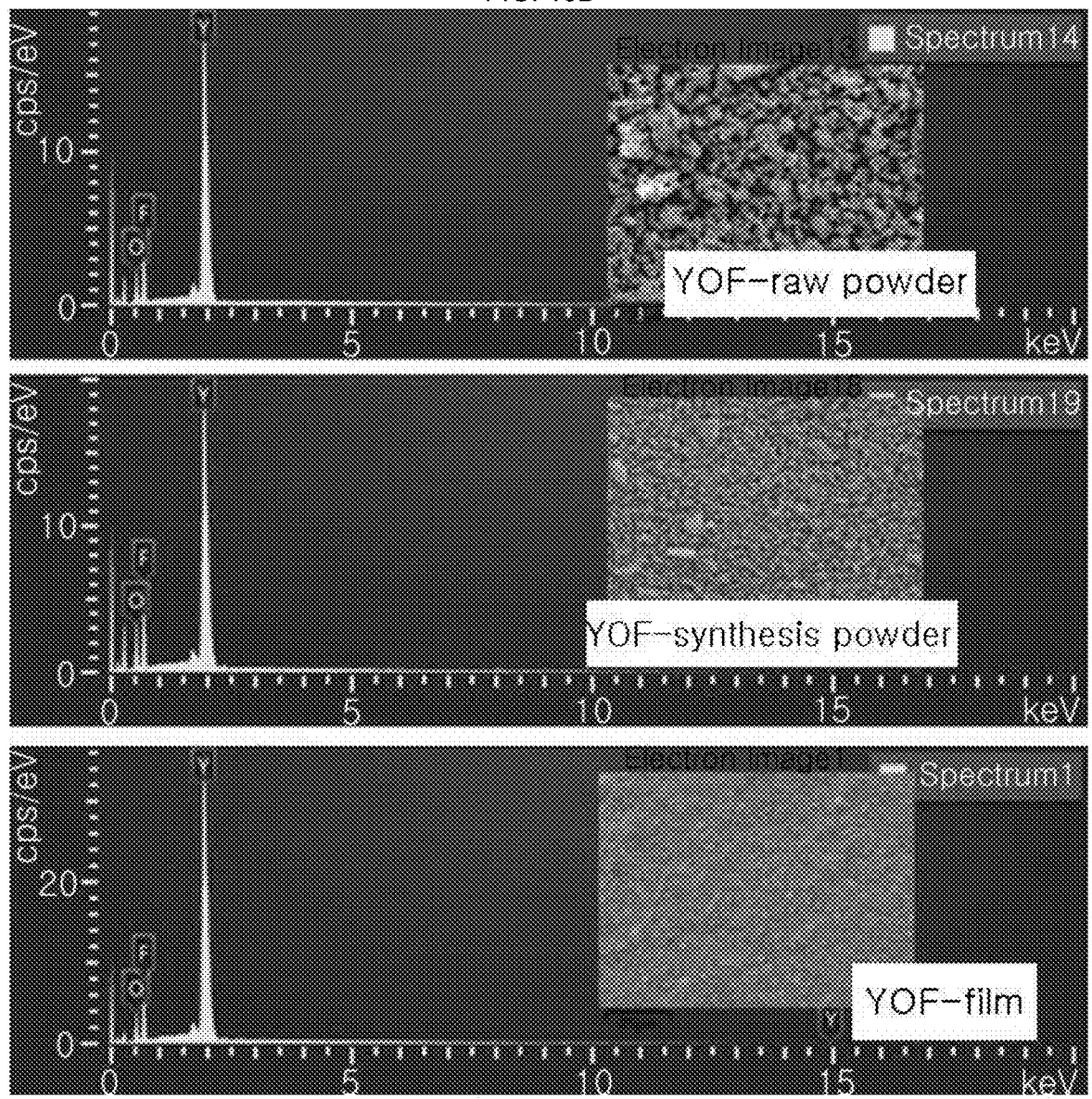

FIGS. 10A and 10B show X-ray diffraction (XRD) patterns for phase analysis results and energy-dispersive X-ray spectroscopy (EDS) analysis results of unpretreated YOF powder, pretreated YOF powder, and a YOF coating film according to various embodiments of the present invention, and FIG. 10O shows a table summarizing weight ratios (Wt %), atomic ratios (At. %) and EDS ratios of unpretreated YOF powder, pretreated YOF powder and a YOF coating film according to various embodiments of the present invention. In FIG. 10A, the X axis indicates a 2 theta (θ) value (degree), and the Y axis indicates relative intensity (arb. unit). In FIG. 10B, the X axis indicates energy (keV), and the Y axis indicates the number of counts (cps/eV). In addition, the EDS ratio is a converted value of the atomic ratio (At. %) of the YOF coating film.

As shown in FIG. 10A, the unpretreated YOF powder (i.e., YOF—raw powder), the pretreated YOF powder (i.e., YOF—synthesis powder) and the YOF coating film (i.e., YOF—film) had all equal 2θ values, suggesting that no changes in physical properties of YOF were observed before/after pretreating and when forming the coating film. That is to say, it is appreciated that YOF powder retains orthorhombic crystal properties before/after pretreating and when forming a coating film. In practice, the pretreating was performed by smashing (powder milling) and then annealing.

As shown in FIG. 10B, the unpretreated YOF powder (YOF—raw powder), the pretreated YOF powder and the YOF coating film demonstrated little difference in the Y:O:F composition ratio.

Figures 10C, 11A:
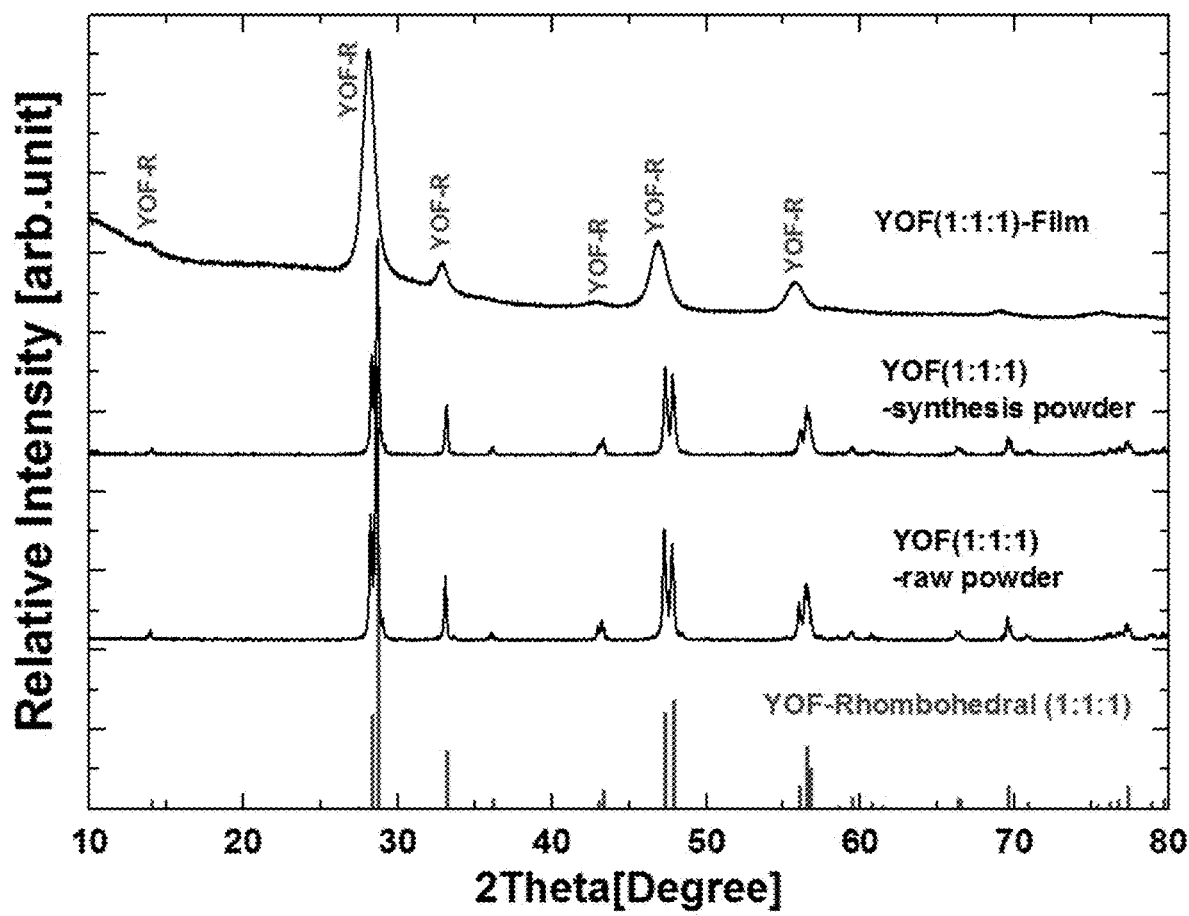
FIGS. 11A and 11B show X-ray diffraction (XRD) patterns for phase analysis results and energy-dispersive X-ray spectroscopy (EDS) analysis results of unpretreated YOF powder, pretreated YOF powder and a YOF coating film according to various embodiments of the present invention.

That is to say, as shown in FIG. 10C, in view of weight ratio (Wt %), atomic ratio (At. %) and EDS ratio, the unpretreated YOF powder, the pretreated YOF powder and the YO F coating film demonstrated little differences before/after pretreating and when forming the coating film. In particular, the unpretreated YOF powder (YOF—raw powder), pretreated YOF powder and the YOF coating film had an EDS ratio of about 5:4:7, suggesting that little differences were observed before/after pretreating and when forming the coating film.

As described above, according to the embodiment of the present invention, it is appreciated that YOF coating film having an orthorhombic crystal structure with an Y:O:F ratio by EDS of about 5:4:7 is formed through aerosol deposition or low temperature spraying.

Example 2

Figure 11B:
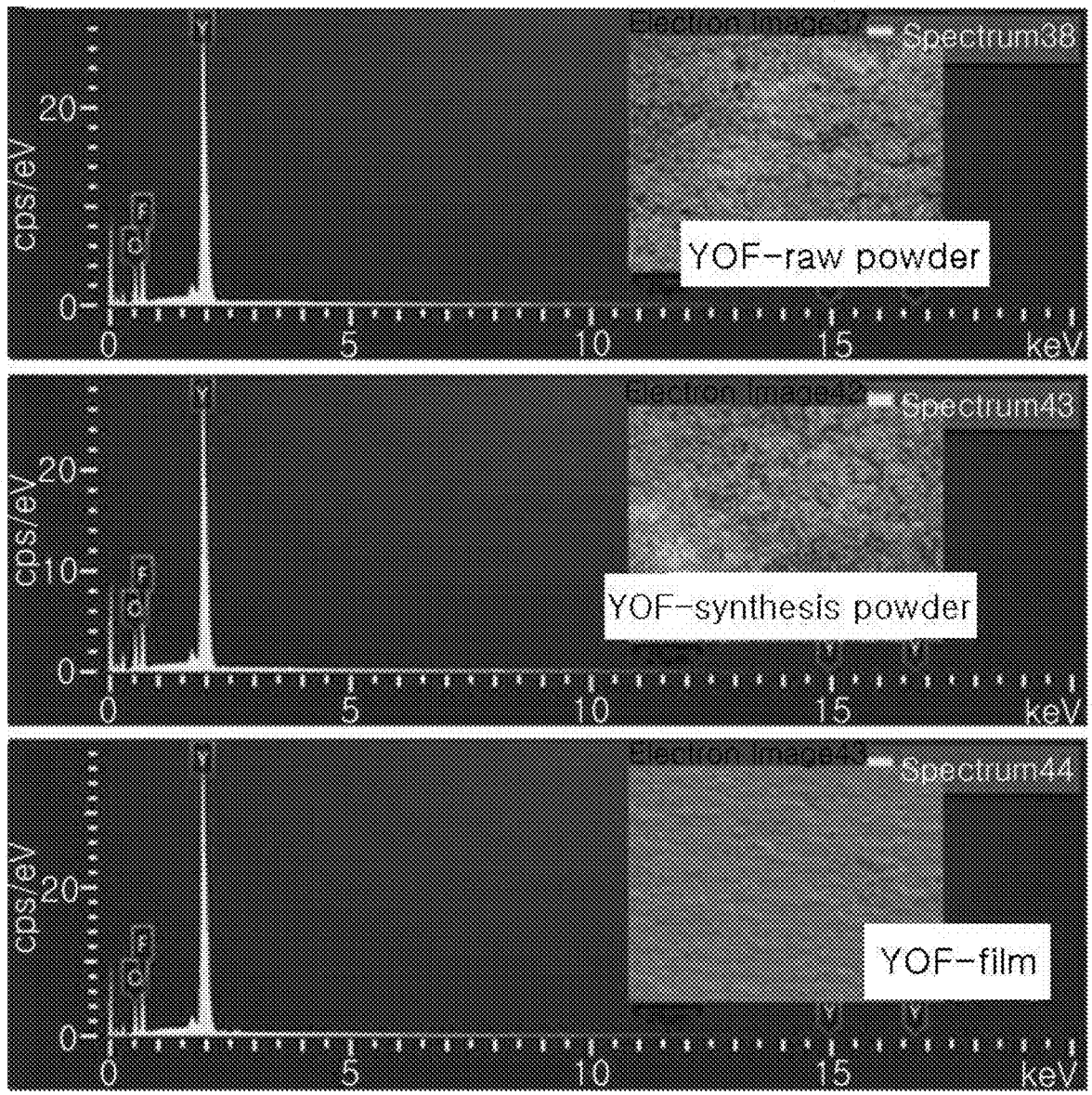
Figure 13A:
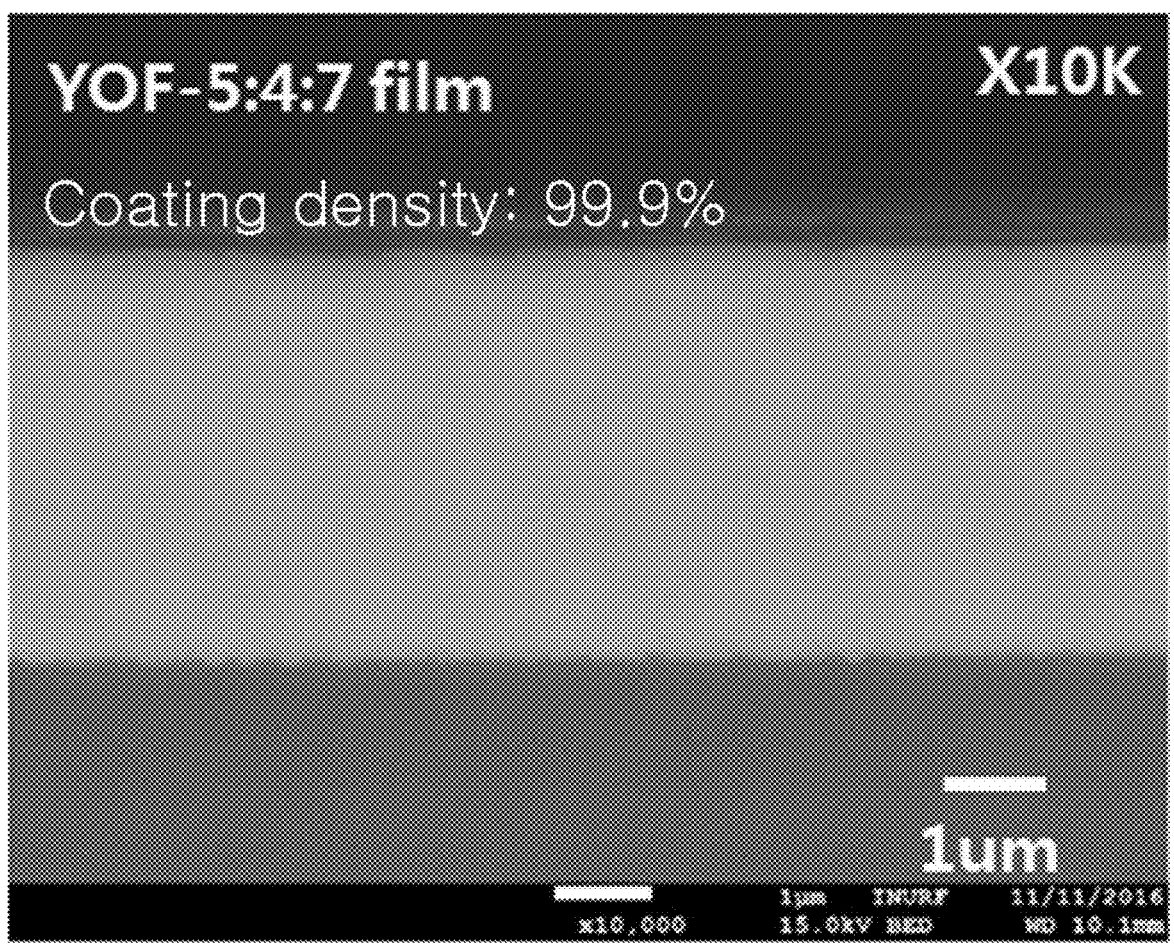
FIGS. 13A and 13B are cross-sectional views of YOF coating films having composition ratios of 5:4:7 and 1:1:1 according to various embodiments of the present invention.
Figure 13B:
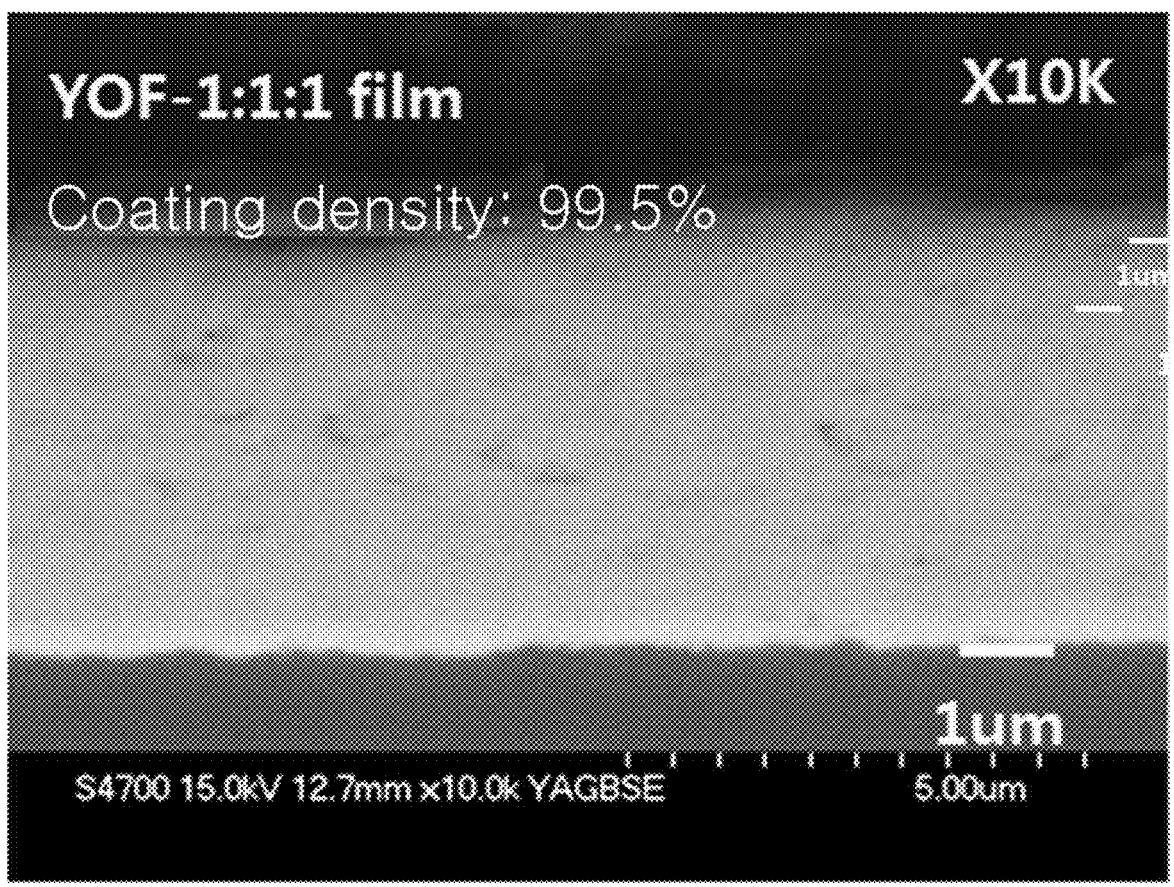

FIGS. 11A and 11B show X-ray diffraction patterns for phase analysis results and energy-dispersive X-ray spectroscopy (EDS) analysis results of unpretreated YOF powder, pretreated YOF powder and a YOF coating film according to various embodiments of the present invention, and FIG. 11C shows a table summarizing weight ratios (Wt %), atomic ratios (At. %) and EDS ratios of the unpretreated YOF powder, the pretreated YOF powder and the YOF coating film according to various embodiments of the present invention. In FIG. 11A, the X axis indicates a 2θ value (degree), and the Y axis indicates relative intensity (arb.unit). In FIG. 11B, the X axis indicates energy (keV), and the Y axis indicates the number of counts (cps/eV). In addition, the EDS ratio is a converted value of the atomic ratio (At. %) of the YOF coating film.

As shown in FIG. 11A, the unpretreated YOF powder (i.e., YOF—raw powder), the pretreated YOF powder (YOF—synthesis powder) and the YOF coating film had all equal 2θ values, suggesting that no changes in physical properties of YOF were observed before/after pretreating and when forming the coating film. That is to say, it is appreciated that YOF powder retains rhombohedral crystal properties before/after pretreating and in forming a coating film. In practice, the pretreating was performed by annealing.

As shown in FIG. 11B, the unpretreated YOF powder (YOF—raw powder), the pretreated YOF powder and the YOF coating film demonstrated little difference in the Y—O—F ratio.

That is to say, as shown in FIG. 11C, in view of weight ratio (Wt %), atomic ratio (At. %) and EDS ratio, the unpretreated YOF powder, the pretreated YOF powder and the YO F coating film demonstrated little differences before/after pretreating and when forming the coating film. In particular, the unpretreated YOF powder (YOF—raw powder), pretreated YOF powder and the YOF coating film had an EDS ratio of about 1:1:1, suggesting that little differences were observed before/after pretreating and when forming the coating film.

As described above, according to the embodiment of the present invention, it is appreciated that YOF coating film having an orthorhombic crystal structure with an Y:O:F ratio by EDS of about 1:1:1 is formed through aerosol deposition or low temperature spraying. In particular, according to the embodiment of the present invention, it is understood that the EDS composition ratio and crystal phases can be maintained without being changed by controlling pretreatment conditions.

FIG. 12 shows a table summarizing characterization data and processing conditions of unpretreated YOF powder, pretreated YOF powder and a YOF coating film according to various embodiments of the present invention.

As shown in FIG. 12, like in Examples 1 and 2, in cases of forming coating films using YOF (5:4:7) powder and YOF (1:1:1) powder through aerosol coating or room temperature vacuum spray coating, the formed coating films had no changes in the composition ratio and crystal phase, compared to initial powder.

As shown in FIGS. 10C, 11C, 13A and 13B, no microcracks were observed from the surface/section of each of the plasma-resistant and/or transparent YOF coating films formed on the substrate according to various embodiments of the present invention. In addition, each of the plasma-resistant and/or transparent YOF coating films formed on the substrate according to various embodiments of the present invention demonstrated a porosity in the range from about 0.01% to about 1%. In detail, the YOF coating film formed using the YOF (5:4:7) powder had a sectional porosity of 0.01%, and the YOF coating film formed using the YOF (1:1:1) powder had a porosity of 0.5%, confirming that high-density YOF coating films were formed by room temperature vacuum spray coating.

Here, the porosity of the YOF coating film was calculated by obtaining an image of a cut YOF coating film photographed using a scanning electron microscope (SEM) and processing the SEM image using image processing software. In addition, as described above, since the porosity of the YOF coating film is between 0.01% and 1.0%, it is understood that the YOF coating film has a packing factor between 99.00% and 99.99%.

Table 1 shows comparison results of various physical properties of the plasma-resistant and/or transparent YOF coating films.

TABLE 1

|  | Pretreated (O) | Unpretreated (X) |
| --- | --- | --- |
| Hardness (GPa) | 6 to 12 | No coating films formed |
| Porosity (%) | 0.01 to 1.0 | No coating films formed |
| Withstand voltage (V/μm) | 50 to 150 | No coating films formed |

As listed in Table 1, when a Vickers hardness value, Hv, of the YOF coating film was calculated in terms of GPa, the YOF coating film had a hardness in the range from about 6 GPa to about 12 GPa. In addition, the YOF coating film had a porosity in the range from 0.01% to 0.1% and a withstand voltage ranging from 50 V/μm to 150 V/μm.

However, in case of using unpretreated YOF powder, any film was not formed at all, so that hardness, etch rate, porosity and withstand voltage data were not acquired. In the case of the unpretreated YOF powder, the particle size distribution of the unpretreated YOF powder is not controlled. Therefore, in case of using a room temperature spray coating process in forming a thin film, powder deposition due to different impact energies depending on particle sizes, or etching of a substrate, may undesirably occur, so that the desired thin film is not formed at all. To avoid this, the YOF powder was pretreated, and YOF—synthesis powder having a particle size distribution to be suitably used for the room temperature spray coating process, thereby forming a high-density YOF coating film using the pretreated YOF powder.

As described above, since the YOF coating film according to the present invention has good properties in view of hardness, etch rate, porosity and withstand voltage, it is understood that the YOF coating film can be used as a protective film of a component of semiconductor/display devices exposed to a plasma environment and/or a transparent window of a display device.

Here, the hardness of the YOF coating film is measured from indentation created by pressing the film using a quadrangular pyramidal diamond indenter. The porosity of the YOF coating film is calculated by cutting the YOF coating film, obtaining an image of the cut film photographed using a scanning electron microscope (SEM) and analyzing the SEM image using a computer having image processing software installed therein. The withstand voltage of the YOF coating film is measured by installing two electrodes on the YOF coating film. These measuring methods are well known to one skilled in the art, and detailed descriptions thereof will be omitted.

Meanwhile, the substrate on which the YOF coating film according to the present invention is located may be an internal component of a process chamber for manufacturing a semiconductor and/or a display device exposed to the plasma environment, and/or a transparent window of a display device, as described above.

The component exposed to the plasma environment may include one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof, but the present invention does not limit the substrate or the component having the YOF coating film formed thereon to those disclosed herein.

In addition, the transparent window may be a glass substrate, a plastic substrate, a sapphire substrate or a quartz substrate. In particular, according to the present invention, when the transparent window is a glass substrate or a plastic substrate, a YOF transparent coating film can be formed at row temperature of between 0° C. and 30° C., the glass substrate or the plastic substrate can be prevented from being damaged.

Here, the plastic substrate may include a thermoplastic semicrystalline polymer having a glass transition temperature (Tg) of about 140° C. and a melting temperature (Tm) of about 340° C., such as, for example, polyethylene terephthalate (PET), polyethylene naphthalate (PEN), or polyether ether ketone (PEEK). In addition, the plastic substrate may include a thermoplastic amorphous plastic substrate, such as, for example, polycarbonate (PC) having a Tg of about 150° C., which is higher than the semicrystalline plastic, and exhibiting no melting temperature, or polyethersulfone (PES) having a Tg of about 220° C. In addition, the plastic substrate may be prepared from a material having a relatively high heat resistance, such as, for example, polyimide (PI) or polyarylate (PAR).

Figure 14:
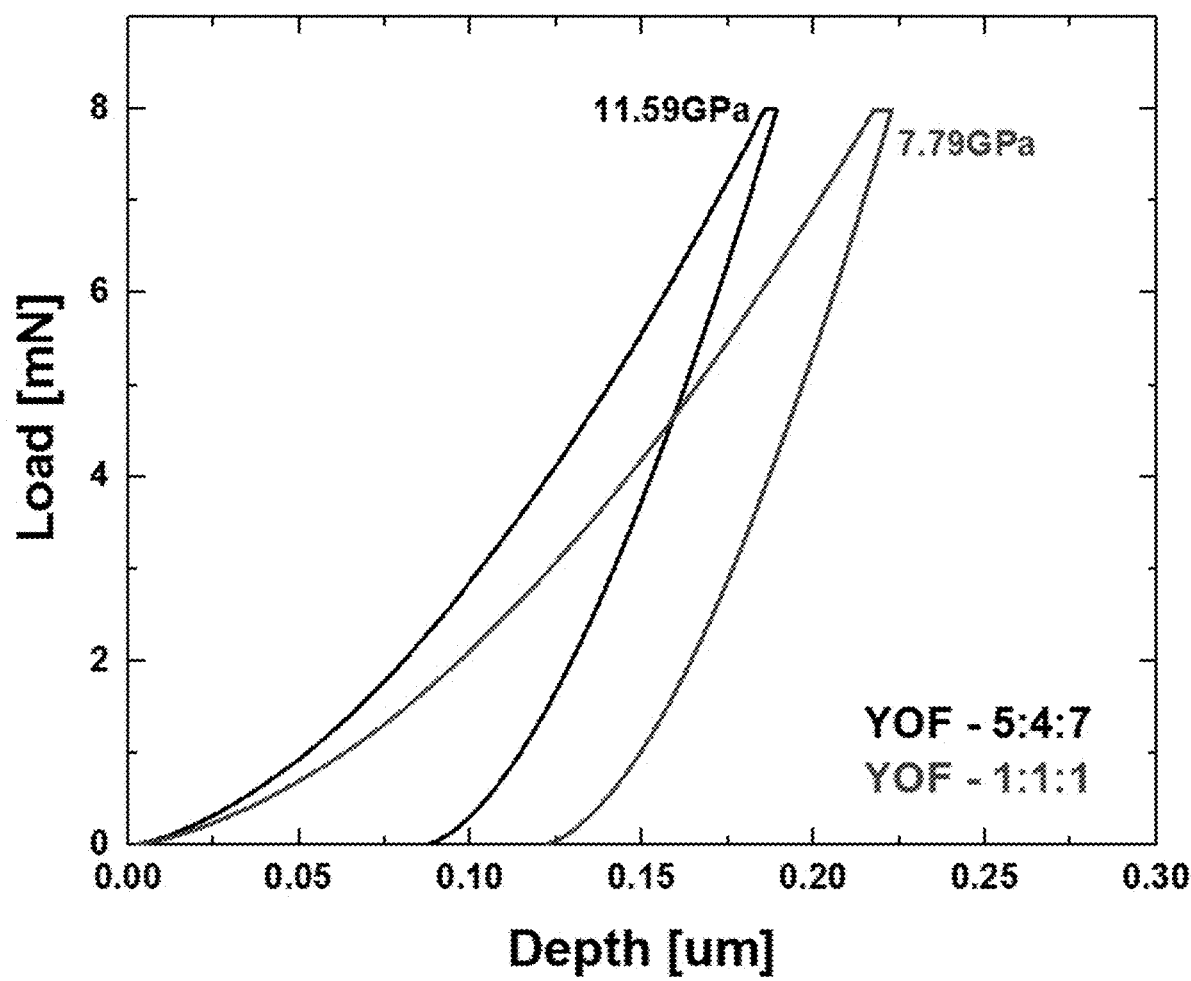
FIG. 14 is a graph showing hardness of a plasma-resistant YOF coating film according to various embodiments of the present invention.

FIG. 14 is a graph showing the hardness of a plasma-resistant YOF coating film according to various embodiments of the present invention. Here, the X axis indicates an indentation depth (nm) of the YOF coating film pressed by a quadrangular pyramidal diamond indenter, and the Y axis indicates a load ($\mu$N) applied by the quadrangular pyramidal diamond indenter.

As shown in FIG. 14, when the quadrangular pyramidal diamond indenter pressed the YOF coating film with a load of about 0 to 8000 $\mu$N, indentation having a depth of not greater than about 200 nm was created in the YOF coating film. When the quadrangular pyramidal diamond indenter was taken away from the YOF coating film with a load of about 8000 to 0 $\mu$N, the indentation having a depth of about 185 to 225 nm was created in the YOF coating film. Specifically, 185 to 190 nm deep indentation was created in the YOF coating film having an Y:O:F composition ratio of 5:4:7 had, and 215 to 225 nm deep indentation was created in the YOF coating film having an Y:O:F composition ratio of 1:1:1.

The hardness of the YOF coating film can be calculated based on data from the characterization graph. The calculated hardness value of the YOF coating film having an Y:O:F composition ratio of 5:4:7 was about 11.8 GPa, and the calculated hardness value of the YOF coating film having an Y:O:F composition ratio of 1:1:1 was about 7.8 GPa. Therefore, it is confirmed that the YOF coating film of the present invention has a hardness of not greater than about 12 GPa. A difference in the hardness value between the YOF coating films respectively having Y:O:F composition ratios of 5:4:7 and 1:1:1 is presumably due to the compactness, rather than the composition ratio, of the coating films formed according to different process conditions. The YOF coating film having an Y:O:F composition ratio of 5:4:7 had a coating density of 99.9%, and the YOF coating film having an Y:O:F composition ratio of 1:1:1 had a coating density of 99.5%. In the latter case, the hardness, which was lowered due to the reduced coating density, was compensated for by controlling the process condition, and a hardness property of about 12 GPa was demonstrated. It was confirmed that the YOF coating film according to the present invention had an hardness of not greater than about 12 GPa.

Here, even after the quadrangular pyramidal diamond indenter was taken away from the YOF coating film, the indentation having a depth of about 185 to 215 nm remained in the YOF coating film, suggesting that thermoplastic deformation occurred to the YOF coating film.

In order to further improve the mechanical strength of a coating film formed using pretreated YOF powder, an oxy-fluoride treatment can be further performed through heat treatment of oxygen or air. In this case, however, it was confirmed that a large amount of oxygen was further diffused. That is to say, in case of performing the oxy-fluoride treatment, the formed YOF coating film had an increased oxygen content in the Y:O:F composition ratio, unlike in an initial powder composition ratio of 5:4:7 or 1:1:1, and Y2O3 may be unexpectedly formed in a relatively high temperature process. In addition, post-annealing (heat-treating) of the coating film may relieve the stress remaining in the coating film, thereby improving mechanical properties of the coating film, which, however, makes a high-temperature (500° C. to 1000° C.) heat treatment difficult to be applied to a light permeable substrate (e.g., a glass, quartz or plastic substrate). In particular, the large amount of oxygen existing in the coating film results in a noticeably reduced transmittance.

Figure 15:
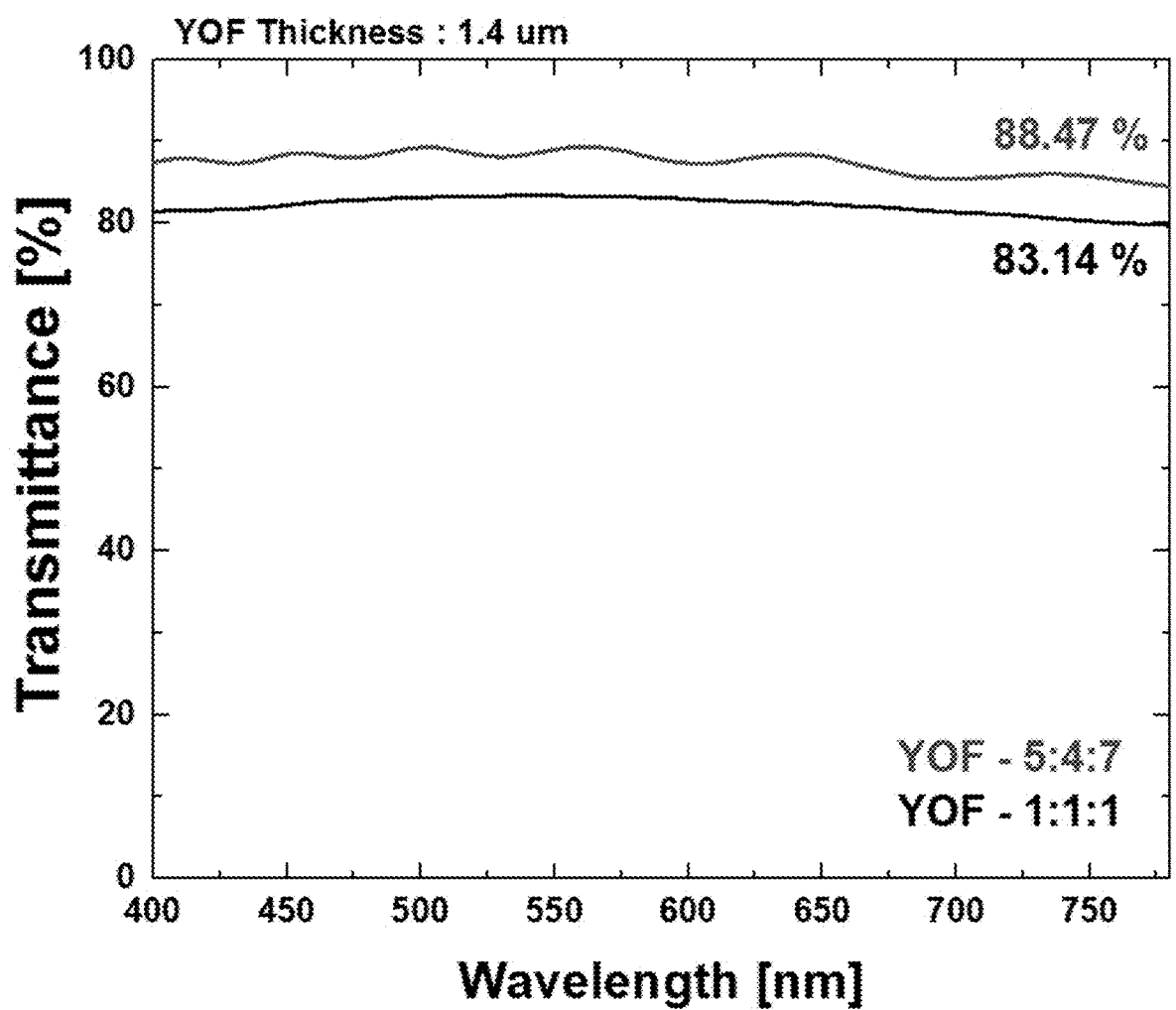
FIG. 15 is a graph showing the transmittance of a YOF coating film according to various embodiments of the present invention relative to the wavelength of light.

FIG. 15 is a graph showing the transmittance of a YOF coating film according to various embodiments of the present invention relative to the wavelength of light. In FIG. 15, the X axis indicates a wavelength (nm) of light, and the Y axis indicates transmittance (%). Here, it is assumed that the YOF coating film has a thickness of about 1.4 µm.

As shown in FIG. 15, in the wavelength range of about 400 nm to about 700 nm (i.e., in the visible light area), the YOF coating film according to the embodiment of the present invention demonstrated transmittance of about 83.1% to 88.5%. Therefore, it is appreciated that the YOF coating film according to the present invention can be suitably used as a protective film for a transparent window of a display device or a plasma-resistant component.

Here, when the unpretreated YOF powder (i.e., YOF—raw powder) was used when forming the YOF coating film, no YOF coating film was formed and comparable data for transmittance was unobtainable. That is to say, in a case of using the YOF powder that was not pretreated by, for example, annealing/ball milling, a film having a predetermined thickness was not formed on a substrate, making transmittance comparison impossible.

While the foregoing embodiments have been described to practice the forming method of an yttrium oxide fluoride coating film and the yttrium oxide fluoride coating film according to the present invention, it will be understood by those of ordinary skill in the art that various changes in form and details may be made therein without departing from the spirit and scope of the present invention as defined by the following claims.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any nonclaimed element as essential to the practice of the invention Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents cited herein are hereby incorporated by reference to the same extent as if each reference were individually and specifically indicated to be incorporated by reference and were set forth in its entirety herein.

What is claimed is:

1. A forming method of an yttrium oxide fluoride (YOF) coating film, the method comprising the steps of:
   pretreating a YOF powder containing yttrium (Y), oxygen (O) and fluorine (F) by heating-treating the YOF powder at a temperature of between 100° C. and 1000° C.;
   receiving a transfer gas supplied from a transfer gas supply unit and receiving the pretreated YOF powder supplied from a powder supply unit to transfer the pretreated YOF powder in an aerosol state; and
   colliding, smashing, and spraying the pretreated YOF powder transferred in the aerosol state onto a substrate in a process chamber to form an yttrium oxide fluoride (YOF) coating film on the substrate;
   wherein a haze value of the YOF coating film ranges from 0.5% to 5%.

2. The forming method of claim 1, wherein a particle diameter of the pretreated YOF powder ranges from 0.1 µm to 12 µm.

3. The forming method of claim 1, wherein the pretreating step further comprises smashing the YOF powder before heat-treating the YOF powder.

4. The forming method of claim 1, wherein a thickness of the YOF coating film ranges from 0.5 µm to 20 µm and visible light transmittance of the YOF coating film ranges from 50% to 95%.

5. The forming method of claim 1, wherein a hardness of the YOF coating film ranges from 6 GPa to 12 GPa.

6. The forming method of claim 1, wherein a porosity of the YOF coating film ranges from 0.01% to 1%, a hardness of the YOF coating film ranges from 6 GPa to 12 GPa, and a withstand voltage property of the YOF coating film ranges from 50 V/µm to 150 V/µm.

7. The forming method of claim 1, wherein an yttrium (Y): oxide (O): fluoride (F) composition atomic ratio of the YOF powder before pretreating, the pretreated YOF powder and the YOF coating film, as determined by energy-dispersive X-ray spectroscopy (EDS), is 5:4:7.

8. The forming method of claim 1, wherein an yttrium (Y): oxide (O): fluoride (F) composition atomic ratio of the YOF powder before pretreating, the pretreated YOF powder and the YOF coating film, as determined by energy-dispersive X-ray spectroscopy (EDS), is 1:1:1.

9. The forming method of claim 1, wherein crystal systems of the YOF powder before pretreating, the pretreated YOF powder, and the YOF coating film include orthorhombic phases.

10. The forming method of claim 1, wherein crystal systems of the YOF powder before pretreating, the pretreated YOF powder, and the YOF coating film include rhombohedral phases.

11. The forming method of claim 1, wherein the substrate is a transparent window of a display device or a component exposed to a plasma environment.

12. The forming method of claim 11, wherein the transparent window is a glass substrate, a plastic substrate, a sapphire substrate or a quartz substrate, and the component is an internal component of a processing chamber for manufacturing semiconductor or display devices.

13. The forming method of claim 12, wherein the component is one selected from the group consisting of an electro static chuck, a heater, a chamber liner, a shower head, a boat for CVD (Chemical Vapor Deposition), a focus ring, a wall liner, a shield, a cold pad, a source head, an outer liner, a deposition shield, an upper liner, an exhaust plate, an edge ring and a mask frame.

14. An yttrium oxide fluoride (YOF) coating film formed by the forming method of claim 1, wherein a thickness of the YOF coating film ranges from 0.5 μm to 20 μm and visible light transmittance of the YOF coating film ranges from 50% to 95%.

15. An yttrium oxide fluoride (YOF) coating film formed by the forming method of claim 1, wherein an yttrium (Y): oxide (O): fluoride (F) composition atomic ratio of the unpretreated YOF powder, the pretreated YOF powder and the YOF coating film, as determined by energy-dispersive X-ray spectroscopy (EDS), is 5:4:7 or 1:1:1.

16. The YOF coating film of claim 15, wherein a hardness of the YOF coating film ranges from 6 GPa to 12 GPa.

17. The YOF coating film of claim 16, wherein when a thickness of the YOF coating film ranges from 0.5 μm to 20 μm and visible light transmittance of the YOF coating film ranges from 50% to 95%.

\* \* \* \* \*

UNITED STATES PATENT AND TRADEMARK OFFICE
CERTIFICATE OF CORRECTION

| | | |
|---|---|---|
| PATENT NO. | : 11,668,011 B2 | Page 1 of 1 |
| APPLICATION NO. | : 16/696701 | |
| DATED | : June 6, 2023 | |
| INVENTOR(S) | : Jae Hyuk Park et al. | |

It is certified that error appears in the above-identified patent and that said Letters Patent is hereby corrected as shown below:

In the Claims

Claim 17, Line 1 reads: "The YOF coating film of claim 16, wherein when a" and should read --The YOF coating film of claim 16, wherein a--

Signed and Sealed this
Eighteenth Day of July, 2023

Katherine Kelly Vidal
*Director of the United States Patent and Trademark Office*